US008197034B2

(12) United States Patent
Miyazawa

(10) Patent No.: US 8,197,034 B2
(45) Date of Patent: Jun. 12, 2012

(54) METHOD FOR PRODUCING LIQUID EJECTING HEAD, LIQUID EJECTING HEAD, AND LIQUID EJECTING DEVICE

(75) Inventor: Hiromu Miyazawa, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 303 days.

(21) Appl. No.: 12/706,406

(22) Filed: Feb. 16, 2010

(65) Prior Publication Data

US 2010/0214370 A1 Aug. 26, 2010

(30) Foreign Application Priority Data

Feb. 24, 2009 (JP) ................................ 2009-041563
Sep. 25, 2009 (JP) ................................ 2009-221560

(51) Int. Cl.
*B41J 2/045* (2006.01)
*H01L 41/00* (2006.01)
*C04B 35/00* (2006.01)

(52) U.S. Cl. ................ 347/68; 347/69; 347/70; 347/71; 347/72; 310/311; 252/62.9 PZ

(58) Field of Classification Search ........................ None
See application file for complete search history.

(56) References Cited

U.S. PATENT DOCUMENTS

2009/0230211 A1* 9/2009 Kobayashi et al. ........ 239/102.2
2010/0073435 A1* 3/2010 Miyazawa et al. .............. 347/71

FOREIGN PATENT DOCUMENTS

JP 2001-223404 8/2001

* cited by examiner

*Primary Examiner* — Matthew Luu
*Assistant Examiner* — Erica Lin
(74) *Attorney, Agent, or Firm* — Workman Nydegger

(57) ABSTRACT

A liquid ejecting head has a piezoelectric element with a first electrode, a piezoelectric layer, and a second electrode. The liquid ejecting head causes pressure changes in a pressure generating chamber communicating with a nozzle opening. The piezoelectric layer has a perovskite structure and is preferentially orientated in a (100) plane. A method for producing the liquid ejecting head includes polarizing the piezoelectric layer by applying an electric field having energy higher than energy required for converting the polarization direction in the <111> direction to the <110> direction and lower than energy required for converting the polarization direction in the <111> direction to the <001> direction when the electric field to be applied to the piezoelectric layer is in the <001> direction vertical to a plane on which the second electrode is provided.

13 Claims, 10 Drawing Sheets

POLARIZATION REVERSING CHANNEL AND ENERGY (1 cell)

METHOD FOR PRODUCING LIQUID EJECTING HEAD, LIQUID EJECTING HEAD, AND LIQUID EJECTING DEVICE

CROSS-REFERENCE TO RELATED APPLICATIONS

This application claims the benefit of priority to Japanese Patent Application No. 2009-041563 filed Feb. 24, 2009, and Japanese Patent Application No. 2009-221560 filed Sep. 25, 2009, the contents of which are hereby incorporated by reference in their entirety.

BACKGROUND

1. Technical Field

The present invention relates to a method for producing a liquid ejecting head provided with a piezoelectric element having a first electrode, a piezoelectric layer, and a second electrode, a liquid ejecting head, and a liquid ejecting device.

2. Related Art

A piezoelectric element for use in liquid ejecting heads, such as an ink jet recording head, is an element in which a piezoelectric layer containing a piezoelectric material showing an electromechanical conversion function is interposed between two electrodes. As the piezoelectric layer, a piezoelectric layer containing lead, zirconium, and titanium, such a piezoelectric layer using lead zirconate titanate (PZT) or the like, has been proposed, for example (e.g., Japanese Unexamined Patent Application Publication No. 2001-223404).

In order for the piezoelectric element for use in a liquid ejecting head or the like to demonstrate excellent piezoelectric properties with which a high displacement can be obtained with a low voltage, it is important that vector components of a polarization moment are present in the direction of an applied electric field. This is because the domain having a polarization moment in a direction opposite to the direction of an electric field contributes to reduce the piezoelectric properties.

Therefore, for example, after a piezoelectric layer is formed, an electric field in the direction same as that of a driving electric field to be applied at the time of liquid ejecting is applied to the piezoelectric layer to thereby perform initialization for making the directions of polarization moments uniform.

However, during the initialization for making the polarization moments of the piezoelectric layer uniform, a relatively high electric field is applied. Therefore, a high energy is required to increase the cost and also the application of a high electric field has had a possibility of deterioration, breakage, or the like of the piezoelectric layer.

Such problems are not limited to ink jet recording heads, but similarly arise in liquid ejecting heads for ejecting other liquids other than ink.

SUMMARY

An advantage of some aspects of the invention is to provide a method for producing a liquid ejecting head capable of suppressing the deterioration or breakage of a piezoelectric layer and increasing piezoelectric properties with a low energy, a liquid ejecting head, and a liquid ejecting device.

According to an aspect of the invention, a method for producing a liquid ejecting head provided with a piezoelectric element that has a first electrode, a piezoelectric layer, and a second electrode and that causes pressure changes in a pressure generating chamber communicating with a nozzle opening, in which the piezoelectric layer has a perovskite structure, and the piezoelectric layer is preferentially orientated in a (100) plane, and the method includes a polarization process of polarizing the piezoelectric layer by applying an electric field having energy higher than energy required for converting the polarization direction in the <111> direction to the <110> direction and lower than energy required for converting the polarization direction in the <111> direction to the <001> direction when the electric field to be applied to the piezoelectric layer is in the <001> direction vertical to a plane on which the second electrode is provided.

In such an aspect, the polarization process can be performed by applying an electric field of an electric field strength having a relatively low energy, and thus the cost can be reduced, and the breakage of the piezoelectric layer can be suppressed.

It is preferable that, in the polarization process, the polarization direction under the conversion turn to the <110> direction when the polarization direction of the piezoelectric layer is converted to the <111> direction from the <111> direction by the application of the electric field. According to this, the polarization direction in the <111> direction can be converted to the <111> direction with a relatively low applied voltage by passing the <110> direction.

It is preferable that, in the polarization process, the piezoelectric layer does not enter a paraelectric state in which a polarization moment disappears. According to this, in the case where the piezoelectric layer enters the paraelectric state when the polarization moment is reversed in the polarization process, a quite high energy is required. However, when the piezoelectric layer is prevented from entering the paraelectric state, the polarization moment can be reversed and initialized with a low applied voltage. Thus, dielectric breakdown of the piezoelectric layer can be suppressed.

It is preferable that the piezoelectric layer contain lead, zirconium, and titanium. According to this, a piezoelectric element excellent in piezoelectric properties can be achieved.

It is preferable that the lattice constant of the piezoelectric layer in the direction vertical to the plane on which the second electrode is provided be lower than the lattice constant in the plane direction of the plane on which the second electrode is provided. According to this, a piezoelectric element excellent in piezoelectric properties can be achieved.

It is preferable that the piezoelectric layer be monoclinic. According to this, a piezoelectric element excellent in durability and piezoelectric properties can be achieved.

According to another aspect of the invention, a liquid ejecting head is produced according to the production method described above.

In such an aspect, a liquid ejecting head excellent in liquid ejecting properties can be achieved at a low cost.

According to another aspect of the invention, a liquid ejecting device is provided with the liquid ejecting head according to the aspects above.

In such an aspect, a liquid ejecting device excellent in printing quality can be achieved at a low cost.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention will be described in detail with reference to embodiments.

First Embodiment

Figure 1:
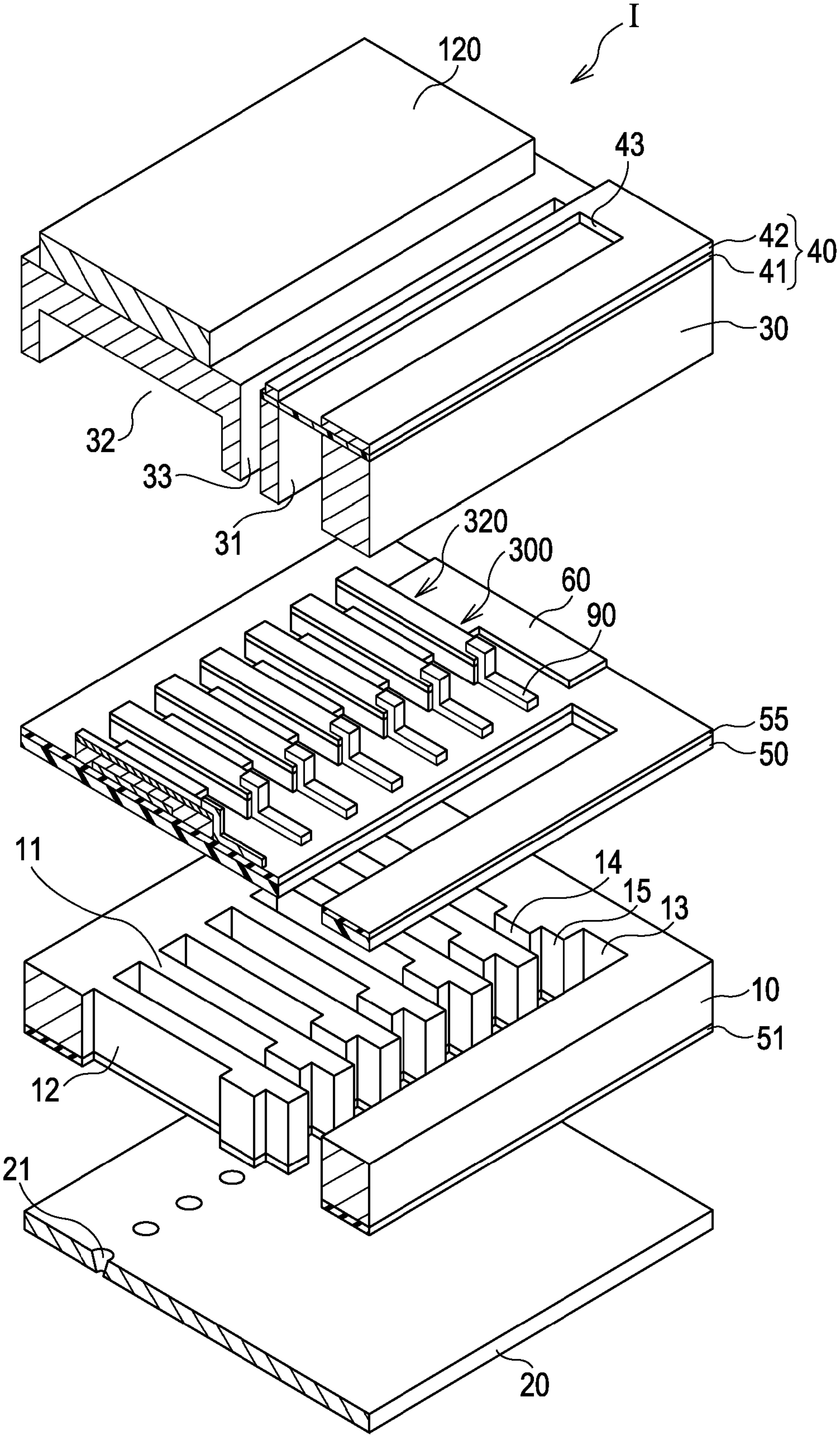
FIG. 1 is an exploded perspective view of a recording head according to a first embodiment.
Figure 2A:
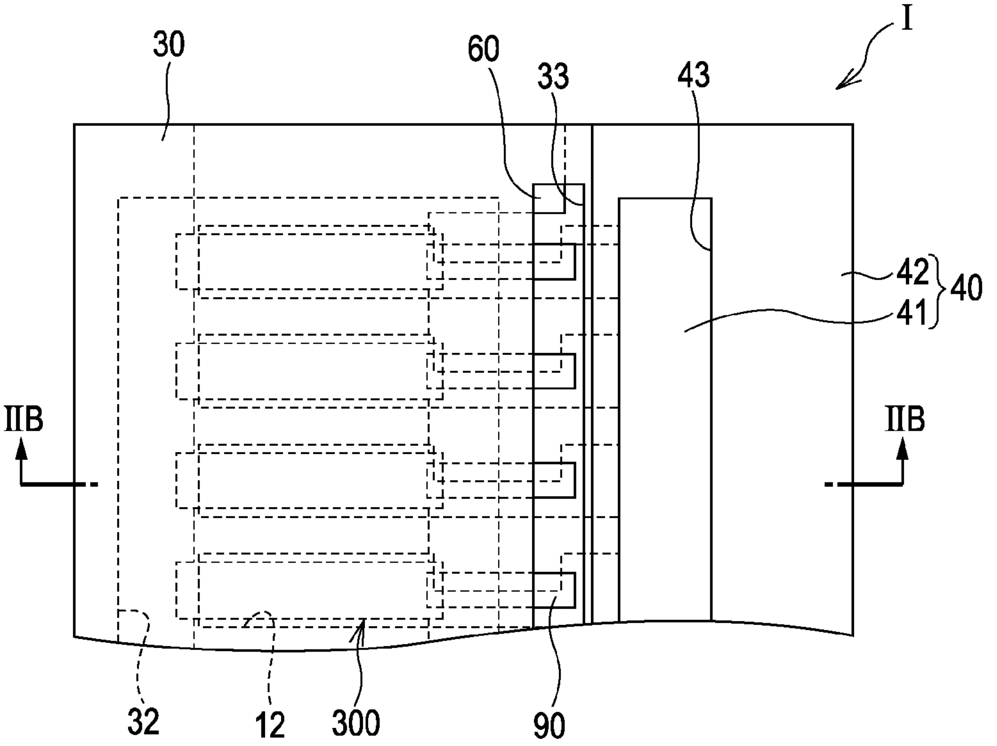
FIG. 2A is a plan view of the recording head according to the first embodiment.
Figure 2B:
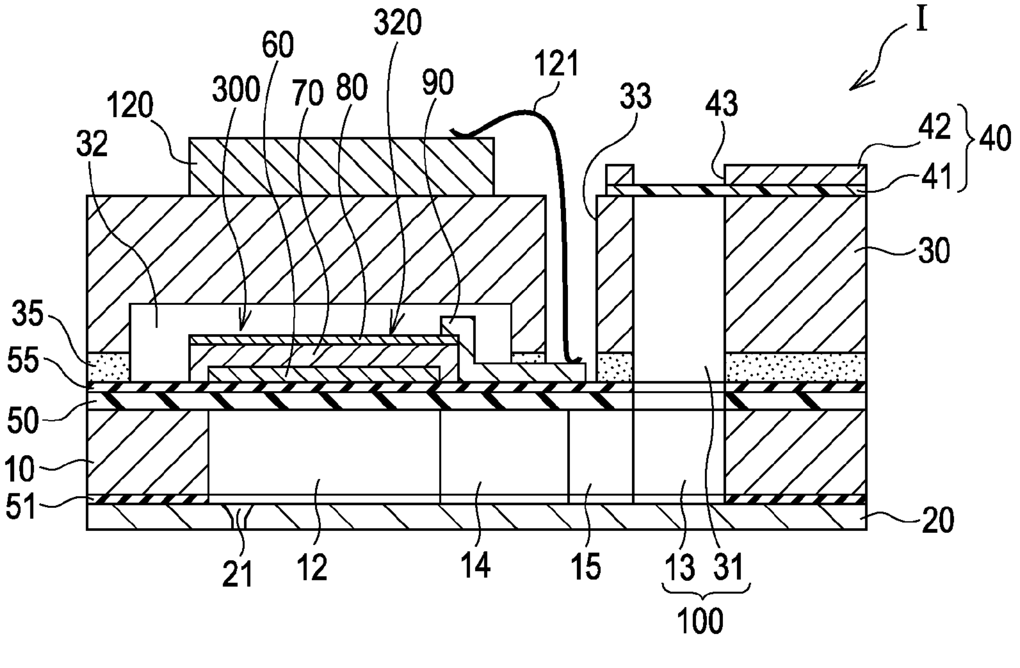
FIG. 2B is a cross sectional view of the recording head according to the first embodiment.

FIG. 1 is an exploded perspective view illustrating the schematic structure of an ink jet recording head as an example of a liquid ejecting head according to a first embodiment of the invention. FIG. 2A is a plan view of a flow path forming substrate and FIG. 2B is a cross sectional view along the IIB-IIB line of FIG. 2A.

As shown in the figures, in this embodiment, a flow path forming substrate 10 contains a silicon single crystal substrate and, on one side thereof, an elastic film 50 containing silicon dioxide as a main component is formed.

The flow path forming substrate 10 is provided with a plurality of pressure generating chambers 12 arranged side by side in the width direction. A communicating portion 13 is formed in a region on the outside in the longitudinal direction of the pressure generating chambers 12 of the flow path forming substrate 10. The communicating portion 13 and each pressure generating chamber 12 are communicated with each other through an ink supply path 14 and a communicating path 15 provided in each pressure generating chamber 12. The communicating portion 13 communicates with a reservoir portion 31 of a protective substrate described later to constitute a portion of a reservoir serving as an ink chamber common to each pressure generating chamber 12. The ink supply paths 14 are formed to have a width narrower than that of the pressure generating chambers 12 and maintain the flow path resistance of an ink flowing into the pressure generating chambers 12 from the communicating portion 13 to be constant. In this embodiment, the ink supply paths 14 are formed by narrowing the width of the flow path from one side, and may be formed by narrowing the width of the flow path from both sides. The ink supply paths may be formed not by narrowing the width of the flow path but by narrowing the flow path in the thickness direction.

To the opening surface side of the flow path forming substrate 10, a nozzle plate 20 in which nozzle openings 21 communicating with the vicinity of the end of the side opposite to the ink supply path 14 of each pressure generating chamber 12 are formed is fixed with an adhesive, a thermowelding film, or the like. The nozzle plate 20 contains, for example, glass ceramics, a silicon single crystal substrate, or stainless steel.

In contrast, on the side opposite to the opening surface of the flow path forming substrate 10, the elastic film 50 is formed as described above, and, on the elastic film 50, an insulator film 55 is formed as described above. Furthermore, on the insulator film 55, a first electrode 60, a piezoelectric layer 70, and a second electrode 80 are laminated in a process described later to thereby constitute a piezoelectric element 300. Here, the piezoelectric element 300 refers to a portion containing the first electrode 60, the piezoelectric layer 70, and the second electrode 80. In general, any one of the electrodes of the piezoelectric element 300 is used as a common electrode, and the other electrode and the piezoelectric layer 70 are patterned for each pressure generating chamber 12. Here, a portion which is constituted by the patterned electrode and the patterned piezoelectric layer 70 and in which a piezoelectric distortion is caused by the application of a voltage to both the electrodes is referred to as a piezoelectric active portion 320. In this embodiment, the first electrode 60 is used as a common electrode of the piezoelectric elements 300 and the second electrode 80 is used as an individual electrode of each piezoelectric element 300, and these can be reversed depending on a driving circuit or wiring without causing any problem. Here, the piezoelectric elements 300 and a vibration plate in which a displacement is caused by driving the piezoelectric elements 300 are generically referred to as a piezoelectric actuator. In the above-described example, the elastic film 50, the insulator film 55, and the first electrode 60 act as the vibration plate, but it is a matter of course that the vibration plate is not limited to the above example. For example, the first electrode only may act as the vibration plate without providing the elastic film 50 and the insulator film 55. The piezoelectric elements 300 may substantially serve as the vibration plate.

The piezoelectric layer 70 contains a piezoelectric material having a perovskite structure represented by General Formula $ABO_3$ having a polarization structure to be formed on the first electrode 60. As the piezoelectric layer 70, ferroelectric materials, such as lead zirconate titanate (PZT) or substances obtained by adding metal oxides, such as niobium oxide, nickel oxide, or magnesium oxide, thereto, etc., are preferable, for example. Specifically, lead titanate ($PbTiO_3$), lead zirconate titanate ($Pb(Zr, Ti)O_3$), lead zirconate ($PbZrO_3$), lead lanthanum titanate ($(Pb, La),TiO_3$), lead lanthanum zirconate titanate $(Pb,La)(Zr, Ti)O_3$), or magnesium niobate lead zirconate titanate ($Pb(Zr, Ti)(Mg,Nb)O_3$) can be used. These crystals thereof all have a pseudo cubic perovskite structure and a typical lattice constant is about 405 pm to 425 pm.

In the piezoelectric layer 70, the crystal is preferentially oriented in the (100) plane and the crystal structure is rhombohedral or monoclinic. In the invention, "the crystal is preferentially oriented in the (100) plane" includes the case where all the crystals are oriented in the (100) plane and the case where almost all crystals (e.g., 90% or more) are oriented in the (100) plane. In the invention "the crystal structure is rhombohedral" includes the case where all the crystals are rhombohedral and the case where almost all the crystals (e.g., 90% or more) are rhombohedral and the remaining crystals that are not rhombohedral are monoclinic, tetragonal, or the like. In this embodiment, the crystal structure of the piezoelectric layer 70 is monoclinic.

Furthermore, it is preferable that the piezoelectric layer 70 be in an engineered domain arrangement in which the polarization direction indicating the direction of the polarization moment is tilted at a given angle with respect to the film plane vertical direction (the thickness direction of the piezoelectric layer 70, i.e., the direction vertical to the plane on which the first electrode 60 or the second electrode 80 is provided). When the polarization direction of the piezoelectric layer 70 is in the engineered domain arrangement, piezoelectric properties favorable as the piezoelectric layer 70 can be obtained.

Figure 3:
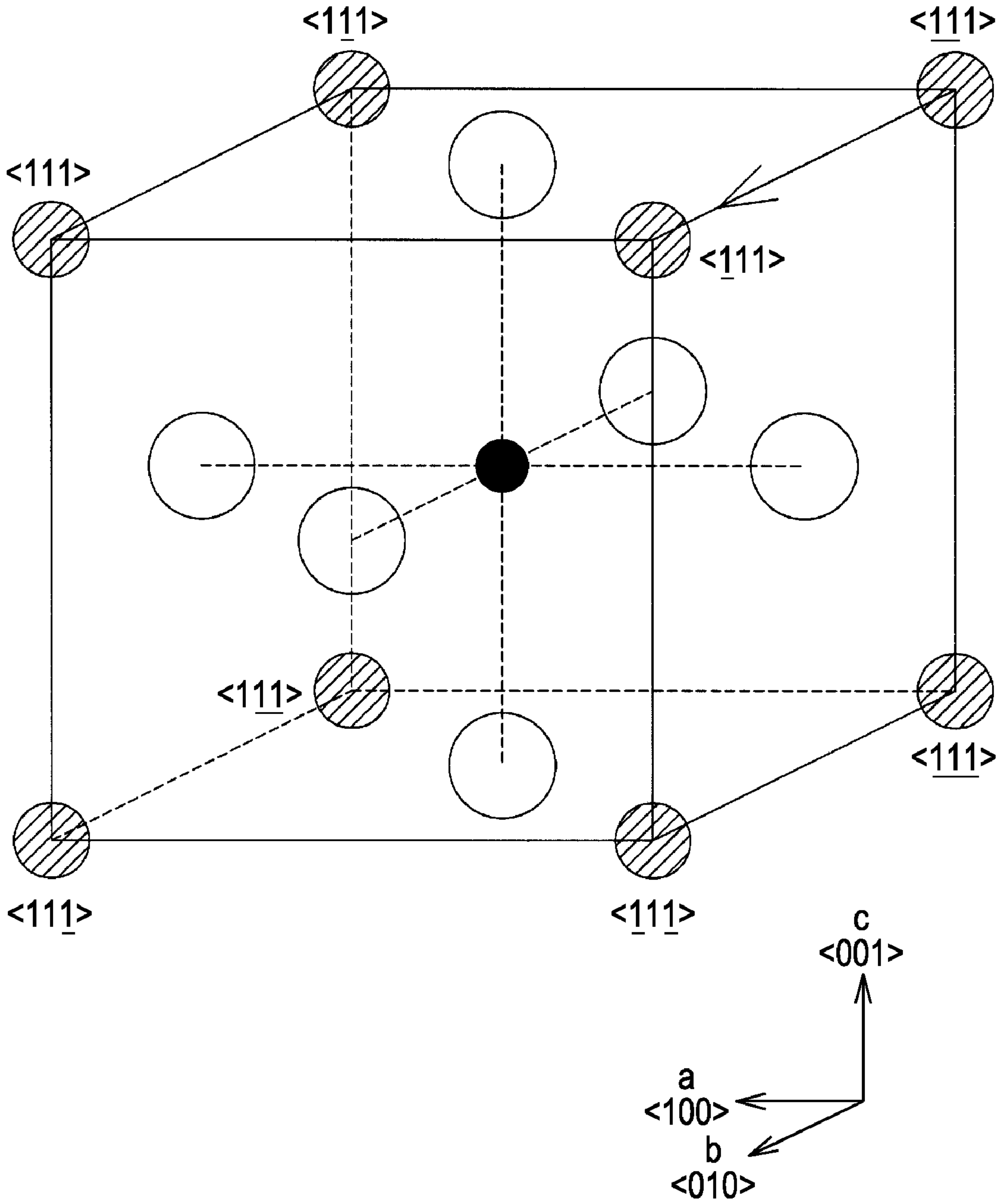
FIG. 3 is a view illustrating a lattice model of a crystal according to the first embodiment.

Here, the crystal structure of the piezoelectric layer 70 has the perovskite structure represented by General Formula $ABO_3$ as described above. Therefore, when $Pb(Zr, Ti)O_3$ is used as the piezoelectric layer 70, lead (Pb) is located at the A site, zirconium (Zr) or titanium (Ti) is located at the B site, and oxygen (O) is located at the C site as illustrated in FIG. 3. The state where the polarization direction of the piezoelectric layer 70 is in the engineered domain arrangement refers to the following state when the crystal constituting the piezoelectric layer 70 is illustrated by a pseudo cubic system. When the crystal axes within the film plane (within the plane on which the first electrode 60 or the second electrode 80 is formed) are defined as the a-axis <100> direction and the b axis <010> direction and the film plane vertical direction is defined as the c axis <001> direction, the polarization directions indicating the direction of the polarization moment are, on the basis of the B site, which is the approximately center portion, in the eight directions of the plus directions of the c axis, i.e., the <111> direction, the <111> direction, the <111> direction, and the <111> direction and the minus directions of the c axis, i.e., the <111> direction, the <111> direction, the <111> direction, and the <111> direction. The underline indicating the direction represents the minus direction in each axis. Therefore, the plus directions of the c axis can also be rewritten as the <111> direction, the <-111> direction, the <1-11> direction, and the <-1-11> direction and the minus direction of the c axis, i.e., the <11-1> direction, the <-11-1> direction, the <1-1-1> direction, and the <-1-1-1> direction. The polarization direction of the piezoelectric layer 70 in the engineered domain arrangement includes the case where the polarization direction is completely agreement with the <111> direction or the like described above in terms of the pseudo cubic system and the case where the polarization direction slightly shifts from the <111> direction described above but is approximately in the <111> direction or the like. The case where the polarization direction is approximately in the <111> direction refers to, for example, the case where the polarization direction is present between the <111> direction and the <100> direction and the angle between the polarization direction and the <111> direction is, for example, 10° or lower. Thus, when the polarization shifts from the <111> direction, the piezoelectric layer 70 becomes monoclinic, and thus a higher displacement can be achieved.

The in-plane (plane on which the second electrode 80 is formed) lattice constant (a axis, b axis) of the piezoelectric layer 70 is preferably higher than the lattice constant (c axis) in the direction vertical to the plane, i.e., the thickness direction. More specifically, it is preferable that the lattice constant of the c axis be lower than the lattice constants of the a axis and the b axis. Thus, when a substance in which the in-plane lattice constants (a axis, b axis) are higher than the lattice constant of the c axis is used as the piezoelectric layer 70, the piezoelectric layer 70 having so-called high displacement properties with which a high displacement can be obtained with a low driving voltage can be used for the piezoelectric layer 70, and thus ink (liquid) ejecting properties can be improved. Here, even when the piezoelectric layer 70 (e.g., PZT) has a composition that renders the piezoelectric layer 70 rhombohedral in the case of a thick film (bulk powder) different from that of this embodiment, the lattice constant of the a axis can be made higher than that of the c axis by utilizing the in-plane stress (tensile stress) in the case where the piezoelectric layer 70 is a thin film as in this embodiment. In this case, the crystal structure is monoclinic.

The thickness of the piezoelectric layer 70 is controlled so that cracking does not occur in the production process thereof and the piezoelectric layer 70 is thickly formed to such an extent that sufficient displacement properties are demonstrated. For example, in this embodiment, the piezoelectric layer 70 is formed to have a thickness of about 0.5 to 2.0 μm. Here, by adjusting the film thickness of the piezoelectric layer 70 in the range above, the discharge amount of ink droplets (droplets) can be increased. For example, when the film thickness of the piezoelectric layer 70 is adjusted to 1.1 μm, the breadth (the shortest width) of the pressure generating chambers 12 is adjusted to 60 μm, and the driving voltage is adjusted to 25 V, the displacement in the film plane vertical direction (thickness direction) of the elastic film 50 as high as about 300 nm can be obtained. As a result, ink droplets of about 5 pL can be ejected.

To each second electrode 80 as an individual electrode of each piezoelectric element 300, a lead electrode 90 that contains, for example, gold (Au) or the like and is drawn from the vicinity of the end of the ink supply path 14 to extend to the insulator film 55 is connected.

Onto the flow path forming substrate 10 on which such a piezoelectric element 300 has been formed, i.e., on the first electrode 60, the insulator film 55, and the lead electrode 90, the protective substrate 30 having the reservoir portion 31 constituting at least a portion of the reservoir 100 is jointed through adhesives 35. In this embodiment, the reservoir portion 31 is formed throughout the width direction of the pressure generating chambers 12 while penetrating the protective substrate 30 in the thickness direction, and, as described above, constitutes the reservoir 100 that is communicated with the communicating portion 13 of the flow path forming substrate 10 to serve as a common ink chamber of each pressure generating chamber 12. The communicating portion 13 of the flow path forming substrate 10 may be divided into a plurality of portions for every pressure generating chamber 12, and only the reservoir portion 31 may be used as a reservoir. Furthermore, for example, only the pressure generating chambers 12 may be provided on the flow path forming substrate 10 and the ink supply path 14 for communicating the reservoir and each pressure generating chamber 12 may be provided on members (e.g., the elastic film 50 and the insulator film 55) interposed between the flow path forming substrate 10 and the protective substrate 30.

In a region of the protective substrate 30 facing the piezoelectric elements 300, a piezoelectric element holding portion 32 having a space to such an extent that the motion of the piezoelectric elements 300 is not impeded is provided. The piezoelectric element holding portion 32 may have a space to such an extent that the motion of the piezoelectric elements 300 is not impeded and the space may or may not be sealed.

As such a protective substrate 30, it is preferable to use a material having substantially the same coefficient of thermal expansion as that of the flow path forming substrate 10. For example, glass, ceramic materials, etc., are preferably used. In this embodiment, the protective substrate 30 is formed using a silicon single crystal substrate, which is the same material as that of the flow path forming substrate 10.

Moreover, on the protective substrate 30, a penetration hole 33 that penetrates the protective substrate 30 in the thickness direction is provided. The penetration hole is provided in such a manner that the vicinity of the end of the lead electrode 90 drawn from each piezoelectric element 300 is exposed into the penetration hole 33.

Onto the protective substrate 30, a driving circuit 120 for driving the piezoelectric elements 300 provided side by side is fixed. As the driving circuit 120, a circuit board, a semiconductor integrated circuit (IC), etc., can be used, for example. The driving circuit 120 and the lead electrode 90 are electrically connected through a connecting wire 121 containing a conductive wire, such as a bonding wire.

Onto such a protective substrate 30, a compliance substrate 40 containing a sealing film 41 and a fixing plate 42 is jointed. Here, the sealing film 41 contains a flexible material having low rigidity and seals one end of the reservoir portion 31. The fixing plate 42 is formed with a relatively hard material. A region of this fixing plate 42 facing the reservoir 100 is thoroughly removed in the thickness direction to serve as an opening portion 43, and thus one end of the reservoir 100 is sealed only with the flexible sealing film 41.

In such an ink jet recording head of this embodiment, an ink is introduced from an ink introduction port connected to an external ink supply member (not illustrated) so that the inside of the ink jet recording head from the reservoir 100 to the nozzle openings 21 is filled with the ink. Thereafter, a voltage is applied to the first electrode 60 and the second electrode 80 corresponding to each pressure generating chamber 12 according to a recording signal from the driving circuit 120 to deform the elastic film 50, the insulator film 55, the first electrode 60, and the piezoelectric layer 70 to thereby increase the pressure in each pressure generating chamber 12, whereby ink droplets are ejected from the nozzle openings 21.

Here, a method for producing the ink jet recording head will be described with reference to FIGS. 4 to 7. FIGS. 4 to 7 are cross sectional views illustrating the method for producing an ink jet recording head.

Figure 4A:
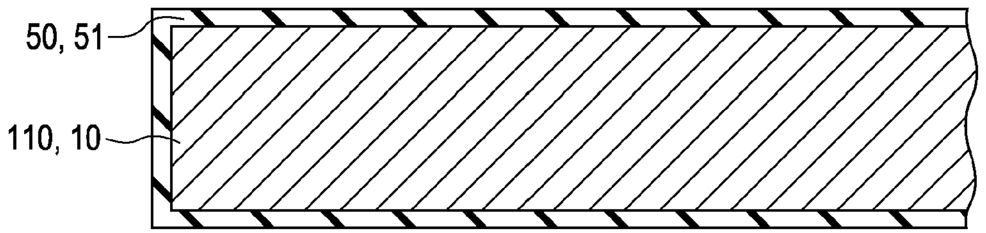
FIG. 4A is a cross sectional view illustrating a method for producing a recording head according to the first embodiment.
Figure 4B:
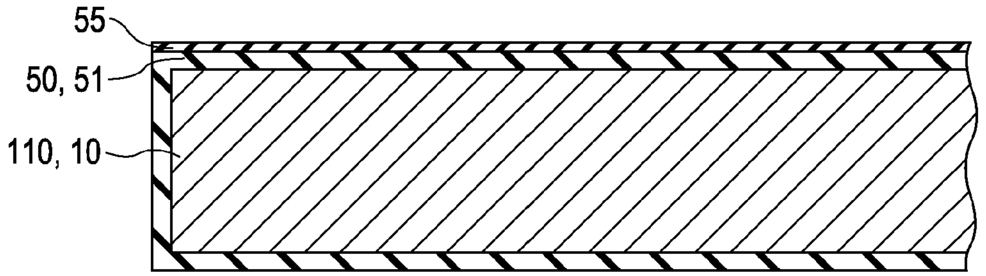
FIG. 4B is a cross sectional view illustrating the method for producing a recording head according to the first embodiment.

First, as illustrated in FIG. 4A, a silicon dioxide film 51 containing silicon dioxide ($SiO_2$) that constitutes the elastic film 50 is formed on the surface of a flow path forming substrate wafer 110 that is a silicon wafer on which a plurality of the flow path forming substrates 10 are integrally formed. Subsequently, as illustrated in FIG. 4B, the insulator film 55 containing zirconium oxide is formed on the elastic film 50 (silicon dioxide film 51).

Figure 4C:
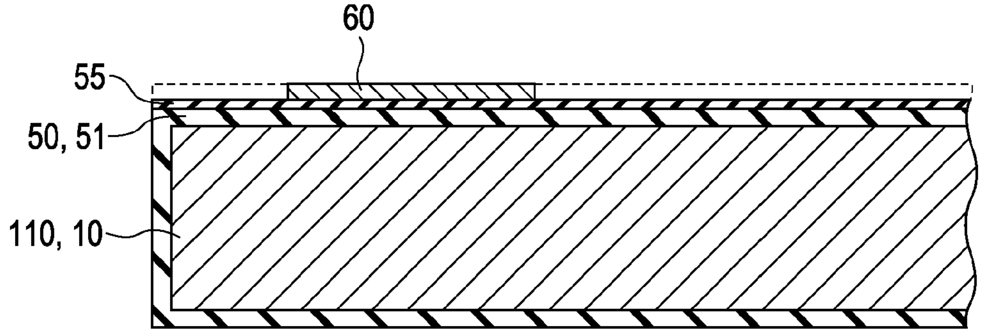
FIG. 4C is a cross sectional view illustrating the method for producing a recording head according to the first embodiment.

Subsequently, as illustrated in FIG. 4C, the first electrode 60 containing platinum and iridium is formed on the insulator film 55, and then is patterned into a given shape. A method for forming the first electrode 60 is not limited, and, for example, a sputtering method, a chemical vapor deposition method (CVD method), etc., are mentioned. In this embodiment, platinum and iridium are used as the materials of the first electrode 60. However, the materials of the first electrode 60 are not limited thereto, and may be only platinum or only iridium and may employ other metal materials.

Figure 5A:
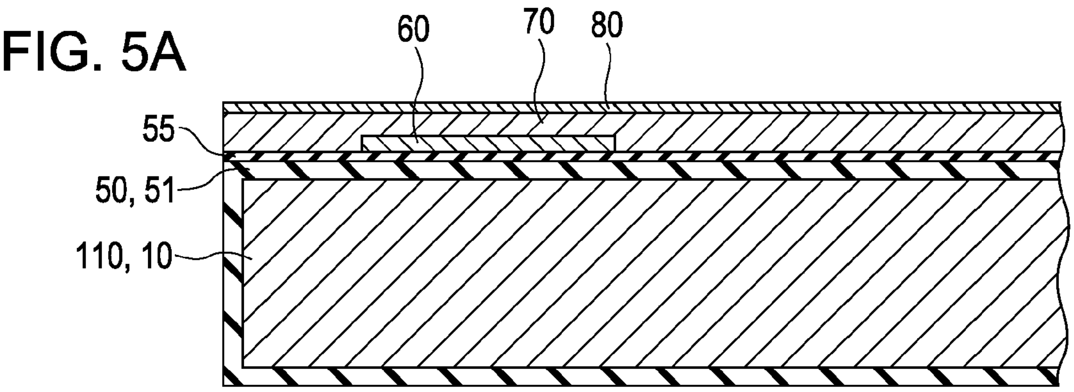
FIG. 5A is a cross sectional view illustrating the method for producing a recording head according to the first embodiment.

Next, as illustrated in FIG. 5A, the piezoelectric layer 70 containing lead zirconate titanate (PZT) and the like and the second electrode 80 containing, for example, iridium, is formed throughout the surface of the flow path forming substrate wafer 110. In this embodiment, the method for forming the piezoelectric layer 70 includes forming the piezoelectric layer 70 using a so-called sol-gel method including applying and drying a so-called sol in which a metal organic substance has been dissolved and dispersed in a solvent to form a gel, and firing the gel at higher temperatures to thereby obtain the piezoelectric layer 70 containing metal oxides. The method for forming the piezoelectric layer 70 is not limited, and, for example, an MOD (Metal-Organic Decomposition) method or PVD (Physical Vapor Deposition) methods, such as a sputtering method or a laser abrasion method, may be used.

Figure 5B:
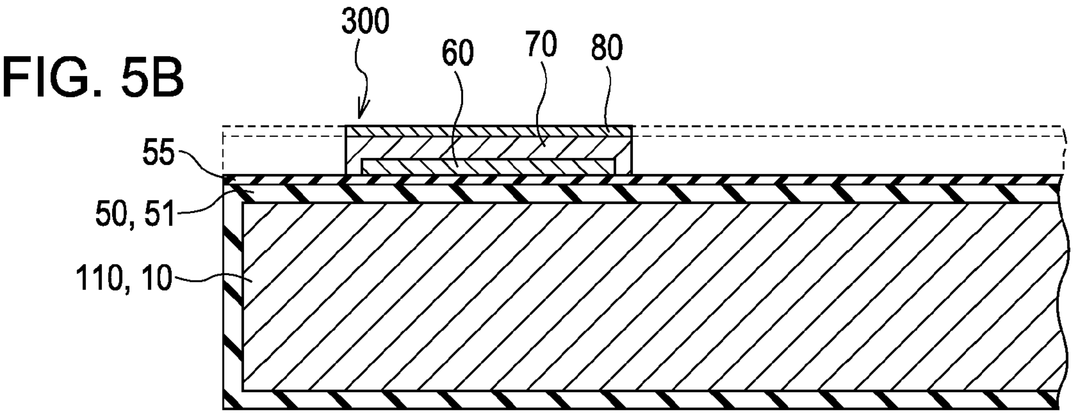
FIG. 5B is a cross sectional view illustrating the method for producing a recording head according to the first embodiment.

Next, as illustrated in FIG. 5B, the piezoelectric element 300 is formed in a region corresponding to each pressure generating chamber 12 by simultaneously etching the second electrode 80 and the piezoelectric layer 70. Here, as the etching of the second electrode 80 and the piezoelectric layer 70, reactive ion etching or dry etching, such as ion milling, is mentioned, for example.

Figure 5C:
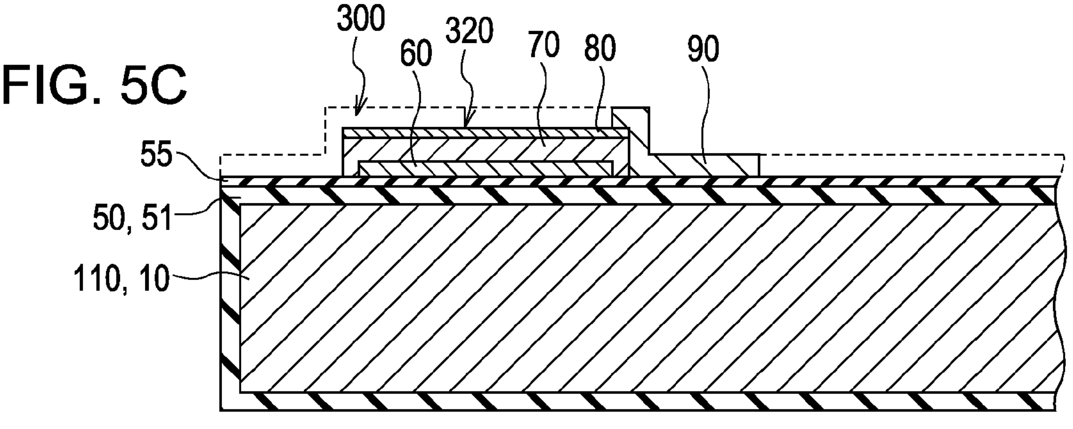
FIG. 5C is a cross sectional view illustrating the method for producing a recording head according to the first embodiment.

Next, as illustrated in FIG. 5C, the lead electrode 90 containing gold (Au) is formed throughout the surface of the flow path forming substrate wafer 110, and then is patterned for every piezoelectric element 300.

Figure 6A:
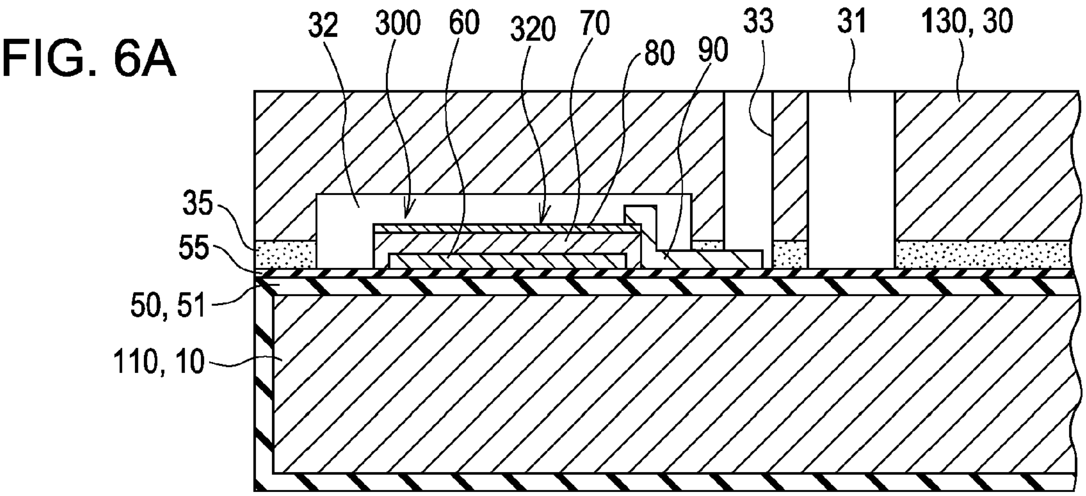
FIG. 6A is a cross sectional view illustrating the method for producing a recording head according to the first embodiment.

Next, as illustrated in FIG. 6A, a protective substrate wafer 130 is adhered onto the flow path forming substrate wafer 110 through adhesives 35. Here, in the protective substrate wafer 130, a plurality of the protective substrates 30 are integrally formed. On the protective substrate wafer 130, the reservoir portion 31 and the piezoelectric element holding portion 32 are formed in advance. By jointing the protective substrate wafer 130 to the flow path forming substrate wafer 110, the rigidity of the flow path forming substrate wafer 110 remarkably increases.

Figure 6B:
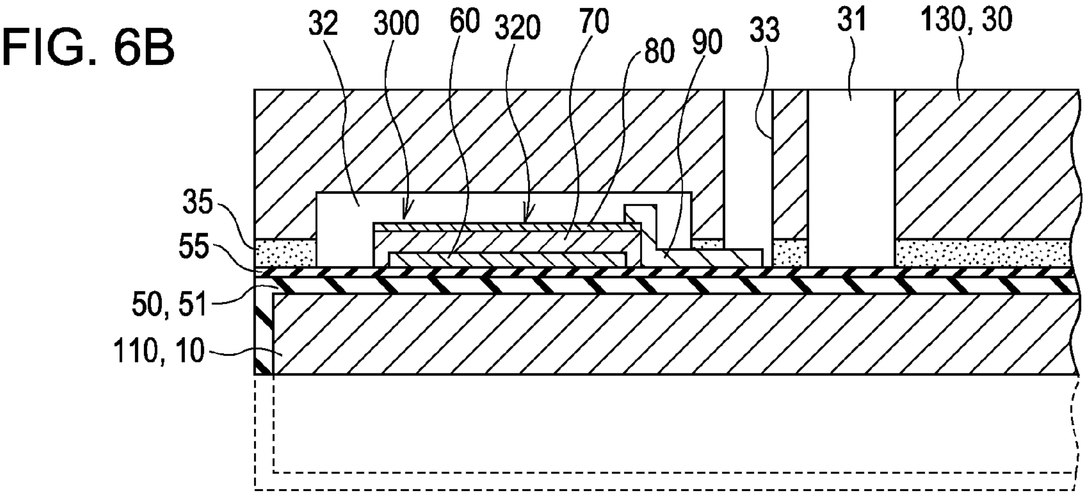
FIG. 6B is a cross sectional view illustrating the method for producing a recording head according to the first embodiment.

Subsequently, as illustrated in FIG. 6B, the thickness of the flow path forming substrate wafer 110 is reduced to a given thickness.

Figure 6C:
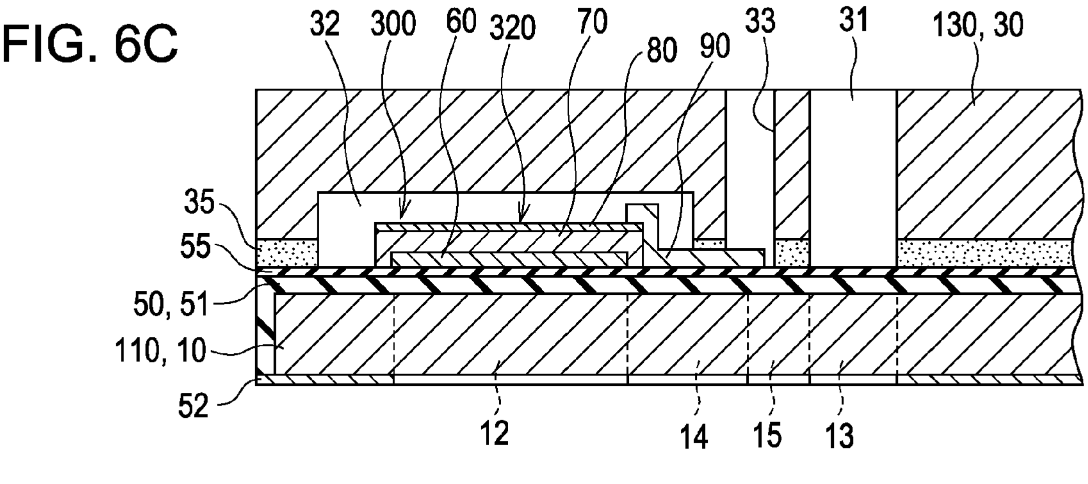
FIG. 6C is a cross sectional view illustrating the method for producing a recording head according to the first embodiment.
Figure 7:
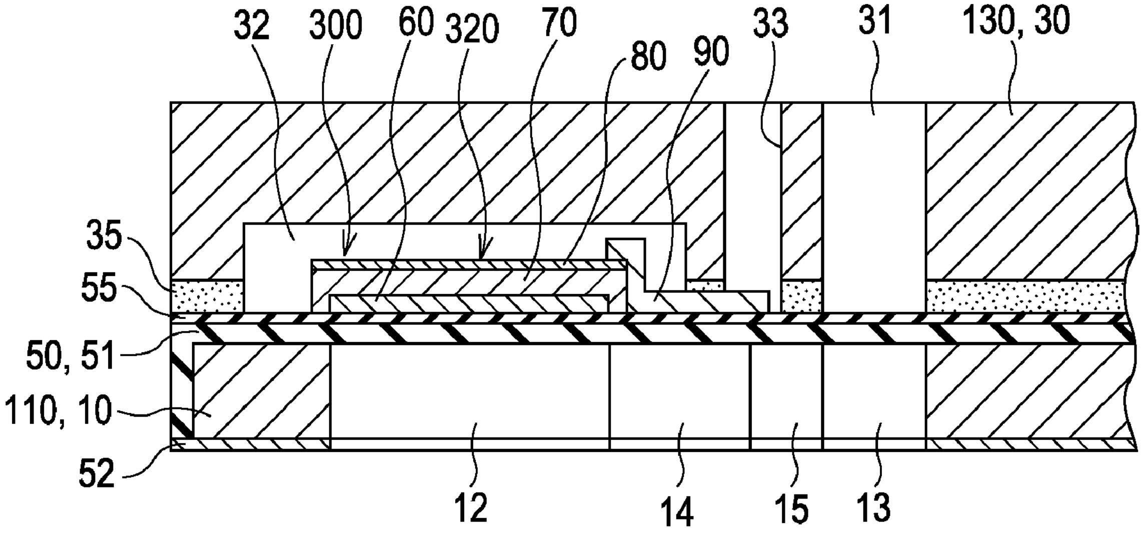
FIG. 7 is a cross sectional view illustrating the method for producing a recording head according to the first embodiment.

Subsequently, as illustrated in FIG. 6C, a mask 52 is newly formed on the flow path forming substrate wafer 110, and is patterned into a given shape. As illustrated in FIG. 7, by anisotropically etching (wet etching) the flow path forming substrate wafer 110 using an alkali solution of KOH or the like through the mask 52, the pressure generating chamber 12 corresponding to each piezoelectric element 300, the communicating portion 13, the ink supply path 14, the communicating path 15, and the like are formed.

Thereafter, the mask 52 on the surface of the flow path forming substrate wafer 110 is removed, and unnecessary portions on the periphery of the flow path forming substrate wafer 110 and the protective substrate wafer 130 are removed by, for example, cutting, such as dicing or the like. Then, the nozzle plate 20 where the nozzle openings 21 are provided is jointed to the side opposite to the protective substrate wafer 130 of the flow path forming substrate wafer 110 and also the compliance substrate 40 is jointed to the protective substrate wafer 130. Then, the flow path forming substrate wafer 110 and the like are divided into the flow path forming substrate 10 of one chip size and the like as illustrated in FIG. 1.

Thereafter, an electric field is applied to the piezoelectric layer 70 to perform a polarization process. Here, the polarization process refers to a process of applying an electric field to the piezoelectric layer 70 in which the polarization direction of the crystal is in an arbitrary direction in producing the piezoelectric element 300 in one direction (the direction connecting the first electrode 60 and the second electrode 80, i.e., the film thickness direction of the piezoelectric layer 70) of the piezoelectric layer 70 to thereby make the directions of the components in the c axis direction (electric field applying direction) of the polarization moment. Here, the direction of an electric field $E_I$ during the polarization process is the same as an actual driving electric field $E_R$ direction during the use of an ink jet recording head I. The dimension of the electric field $E_I$ during the polarization process is made higher than the absolute value of the actual driving electric field $E_R$ during the use of the ink jet recording head I. Thus, the polarization process can be sufficiently performed, and a sufficient piezoelectric displacement can be obtained when the ink jet recording head I is used. For example, a typical dimension of the electric field $E_I$ during the polarization process is 30 V to 60 V. In order to sufficiently polarize the piezoelectric layer 70, the electric field $E_I$ value during the polarization process is required to be higher. In contrast, when the electric field $E_I$ during the polarization process is high, the cost of the driving circuit during the polarization process sharply increases. By applying a high electric field $E_I$ to the piezoelectric layer 70 during the polarization process, cracking may occur in the piezoelectric layer 70, resulting in structure breakage. Therefore, it is required to perform a sufficient polarization process by applying a low electric field $E_I$ during the polarization process.

Figure 8:
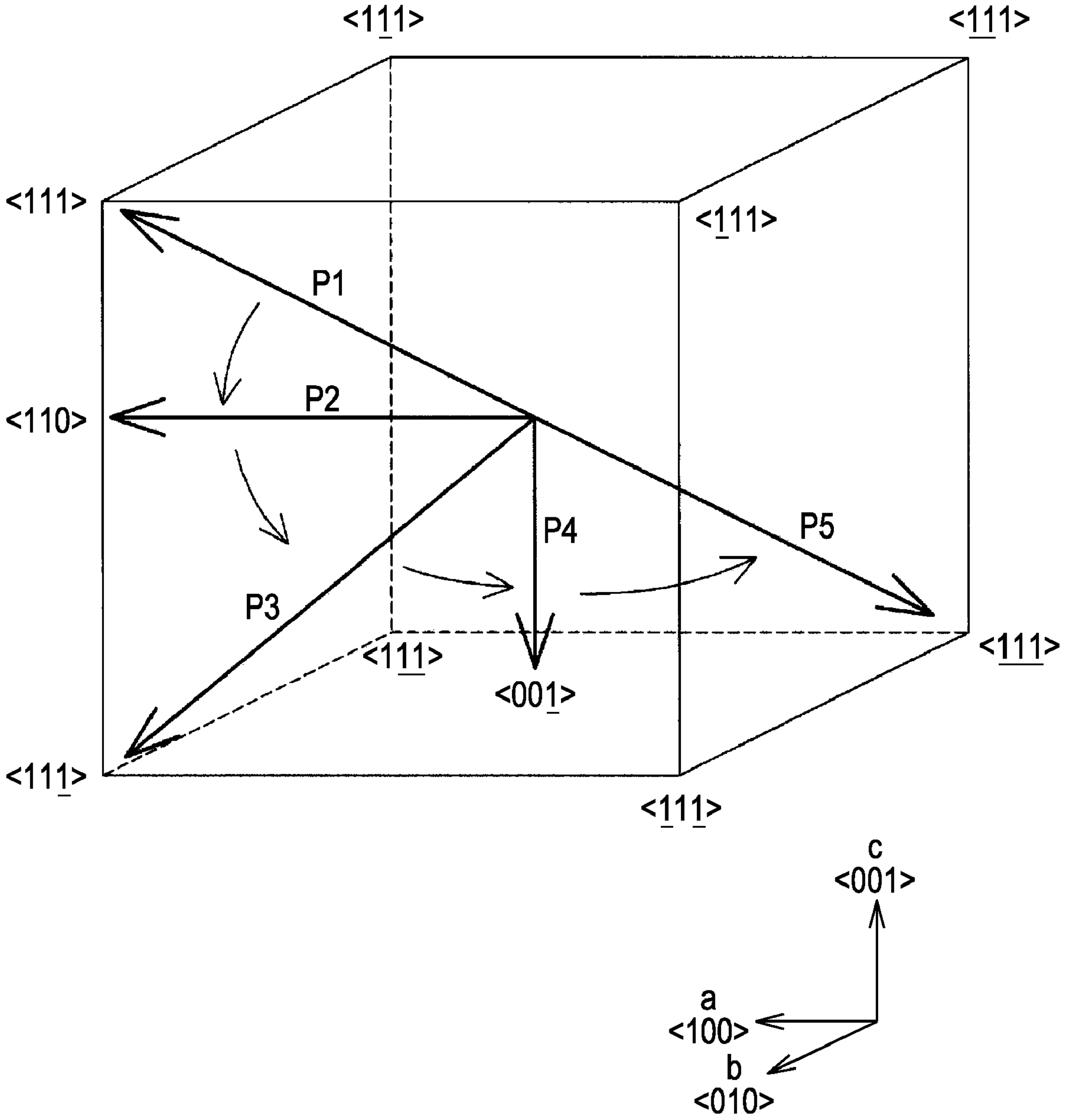
FIG. 8 is a view schematically illustrating changes in the directions of polarization axes of the crystal according to the first embodiment.

In this embodiment, an electric field is applied to the piezoelectric layer 70 in the <001> direction (from the first electrode 60 to the second electrode 80) which is a direction vertical to the film plane (i.e., the plane on which the first electrode 60 or the second electrode 80 is formed). Specifically, for example, by applying an electric field in the <001> direction to the piezoelectric layer 70 in which the polarization directions are in the <111> direction, the <111> direction, the <111> direction, and the <111> direction, the polarization directions are converted to the <111> direction, the <111> direction, the <111> direction, and the <111> direction, respectively, as illustrated in FIG. 8. More specifically, for example, a polarization moment P1 whose polarization direction is in the <111> direction is not converted to a polarization moment P5 or the like whose polarization direction is in the <111> direction but converted to a polarization moment P3 whose polarization direction is in the <111> direction by moving only the c axis.

The dimension (electric field strength) of the applied electric field in this case is made higher than energy required to convert the polarization direction when the polarization direction is in the <111> direction (polarization moment P1) to the polarization direction in the <110> direction (polarization moment P2) and is made lower than energy required to convert the polarization direction (P1) in the <111> direction to the polarization direction in the <001> direction (polarization moment P4). By applying the electric field of such electric field strength, the polarization direction in the <111> direction (P1) can be converted to the <111> direction (P3) by passing the <110> direction (P2). Similarly, the other polarization directions, i.e., the <111> direction, the <111> direction, and the <111> direction can be converted to the <111> direction, the <111> direction, and the <111> direction by passing the <110> direction, the <110> direction, and the <110> direction, respectively.

Figure 9:
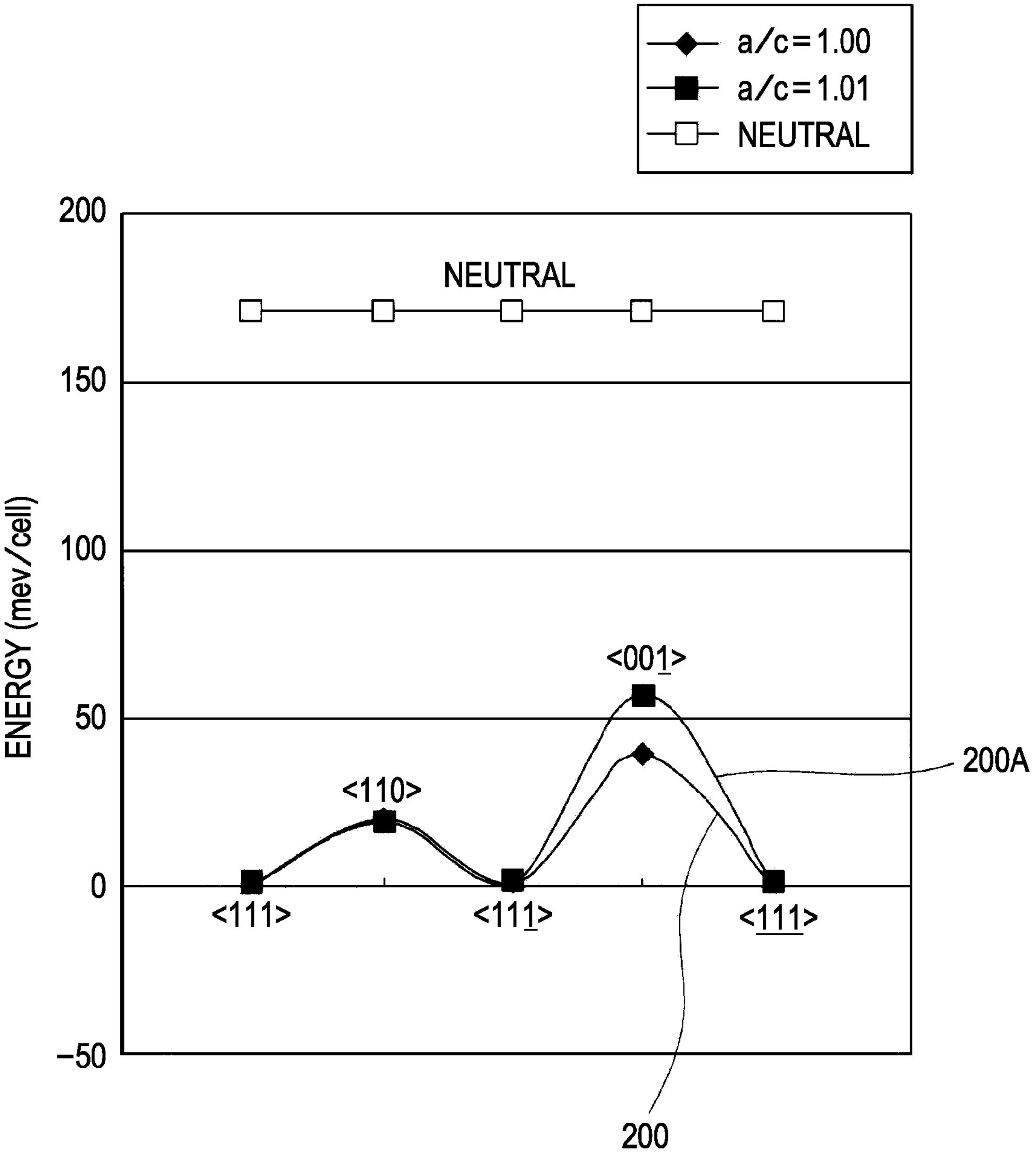
FIG. 9 is a graph illustrating the results of first principle electronic structure calculations of this embodiment.

Here, the relationship between paths and energies (meV/cell) when, for example, the polarization moment P1 whose polarization direction is in the <111> direction is moved so that the polarization moment P1 is converted to the polarization moment P2 in the <110> direction, the polarization moment P3 in the <111> direction, the polarization moment P4 in the <001> direction, and the polarization moment P5 in the <111> direction is determined by first principle electronic structure calculations. The results are illustrated in FIG. 9. In FIG. 9, "neutral" represents a paraelectric state. Moreover, in FIG. 9, the relationship has been determined based on 1 unit cell representing 1 unit cell of the piezoelectric layer 70. The state where the piezoelectric layer 70 is in the paraelectric state refers to a state where the polarization moment disappears and the polarization moment does not exist.

As illustrated in FIG. 9, in order to convert the polarization moment P1 whose polarization direction is in the <111> direction to the polarization moment P3 whose polarization direction is moved to the <111> direction by passing the <110> direction, about 20 meV/cell is required. In contrast, in order to convert the polarization moment P1 whose polarization direction is in the <111> direction to the polarization moment P5 whose polarization direction is moved to the <111> direction by passing the <110> direction and the <001> directions, about 40 meV/cell or more is required. As a path for reversing the polarization direction from the <111> direction to the <111> direction, which is opposite thereto, it is considered that the energy to be required for passing the <110> direction and the <001> direction described above is the lowest.

The line 200 illustrated in FIG. 9 represents the case where the a axis length and the b axis length of the crystal are the same (e.g., 420 pm). The case where the a axis length (b axis length) is longer than the c axis length (e.g., 1.01 times) is represented by the line 200A illustrated in FIG. 9, which shows that a higher energy is required in order for the polarization moment in the <111> direction to pass the <001> direction. Here, the first principle electronic structure calculations performed in this embodiment has been performed using an ultra soft potential method based on a density functional theory in the range of a Generalized Gradient Approximation. The energy cut off is 40 hartree, the electron density cut off is 360 hartree, and the k point mesh of in a reciprocal lattice is 4×4×4.

Considering the above facts, by adjusting the electric field strength for performing the polarization process of the piezoelectric layer 70 to be higher than the dimension for converting the polarization direction in the <111> direction to the <111> direction by passing the <110> direction, i.e., the energy required for converting the polarization direction to the polarization direction in the <110> direction, and lower than the energy required for converting the polarization direction in the <111> direction to the polarization direction in the <001> direction, the polarization process can be performed with a low energy without reversing the polarization direction into the opposite direction.

Thus, the path for reversing the polarization direction can be specified by specifying the electric field strength of the electric field to be applied. By passing the path requiring the lowest energy, the electric field strength can be made low and the energy can be saved to thereby reduce the cost. There is no necessity of applying a high electric field to the piezoelectric layer 70 to perform the polarization process, damages caused by the application of an electric field to the piezoelectric layer 70 can be suppressed. In particular, when the piezoelectric layer 70 having a lattice constant in which the a axis length (b axis length) is longer than the c axis length, such effects are notably demonstrated.

It is preferable that, in the polarization process, the piezoelectric layer 70 does not enter the paraelectric state that the polarization moment disappears. More specifically, as illustrated in FIG. 9, in this embodiment, when the polarization direction is in the <111> direction, by adjusting the electric field strength with which the polarization process of the piezoelectric layer 70 is performed to a dimension with which the polarization direction is converted from the <111> direction to the <111> direction by passing the <110> direction, i.e., by adjusting the electric field strength to be higher than energy required for converting the polarization direction to the polarization direction in the <110> direction and lower than energy required for converting the polarization direction in the <111> direction to the polarization direction in the <001> direction, the energy can be considered to have a dimension with which the piezoelectric layer 70 does not enter the paraelectric state "neutral" (FIG. 9).

As illustrated in FIG. 9, in order for the piezoelectric layer 70 to enter the paraelectric state when the polarization moment is reversed in the polarization process, a quite high energy state (energy quite higher than the energy required for converting the polarization direction in the <111> direction to the polarization direction in the <001> direction) is required. However, since the polarization moment can be reversed and initialized with a low applied voltage by performing the polarization process with energy with which the piezoelectric layer 70 does not enter the paraelectric state, the dielectric breakdown of the piezoelectric layer 70 can be suppressed by making the voltage to be applied to the piezoelectric layer 70 low.

This embodiment describes that the electric field strength with which the polarization process is performed is, based on the polarization direction in the <111> direction, higher than the energy required for converting the polarization direction to the polarization direction in the <110> direction and lower than the energy required for converting the polarization direction in the <111> direction to the polarization direction in the <001> direction. This can apply in the polarization directions on the basis of other directions. More specifically, for example, the dimension of the electric field strength is the same as the dimension of the electric field strength higher than the energy required for converting the polarization direction to the polarization direction in the <110> direction on the basis of the <111> direction and lower than the energy required for converting the polarization direction in the <111> direction to the polarization direction in the <001> direction. Similarly, it can be said that, even when the polarization direction of the initial state is in the <111> direction, the dimension of the electric field strength is higher than the energy required for converting the polarization direction to the polarization direction in the <110> direction and lower than the energy required for converting the polarization direction in the <111> direction to the polarization direction in the <001> direction. More specifically, the applied electric field of the invention can be said to be electric field strength (energy) required for reversing the polarization direction by only the c axis direction.

By applying the electric field of such electric field strength, the polarization moments in the polarization directions of the <111> direction, the <111> direction, and the <111> direction other than the <111> direction can also be moved so that the polarization directions are reversed in the <111> direction, the <111> direction, and the <111> direction, respectively, by only the c axis direction.

Other Embodiments

One embodiment of the invention is described above, but the invention is not limited to the embodiment. For example, in the first embodiment described above, the silicon single crystal substrate is mentioned as the flow path forming substrate 10, but the flow path forming substrate 10 is not limited thereto. For example, the invention is effective also in the case of an SOI substrate, a glass substrate, an MgO substrate, etc. The elastic film 50 containing silicon dioxide is provided at the bottom of the vibration plate, but the structure of the vibration plate is not limited thereto.

The first embodiment described above describes a pressure generating member for causing pressure changes in the generating chambers 12 using an actuator device having the piezoelectric elements 300 of a thin film type, but the pressure generating member is not limited thereto. For example, a thick film type actuator device that is formed by a method of adhering a green sheet or the like, a vertical vibration type actuator device that extends in the axial direction by alternately laminating an piezoelectric material and an electrode forming material, or the like can be used.

Figure 10:
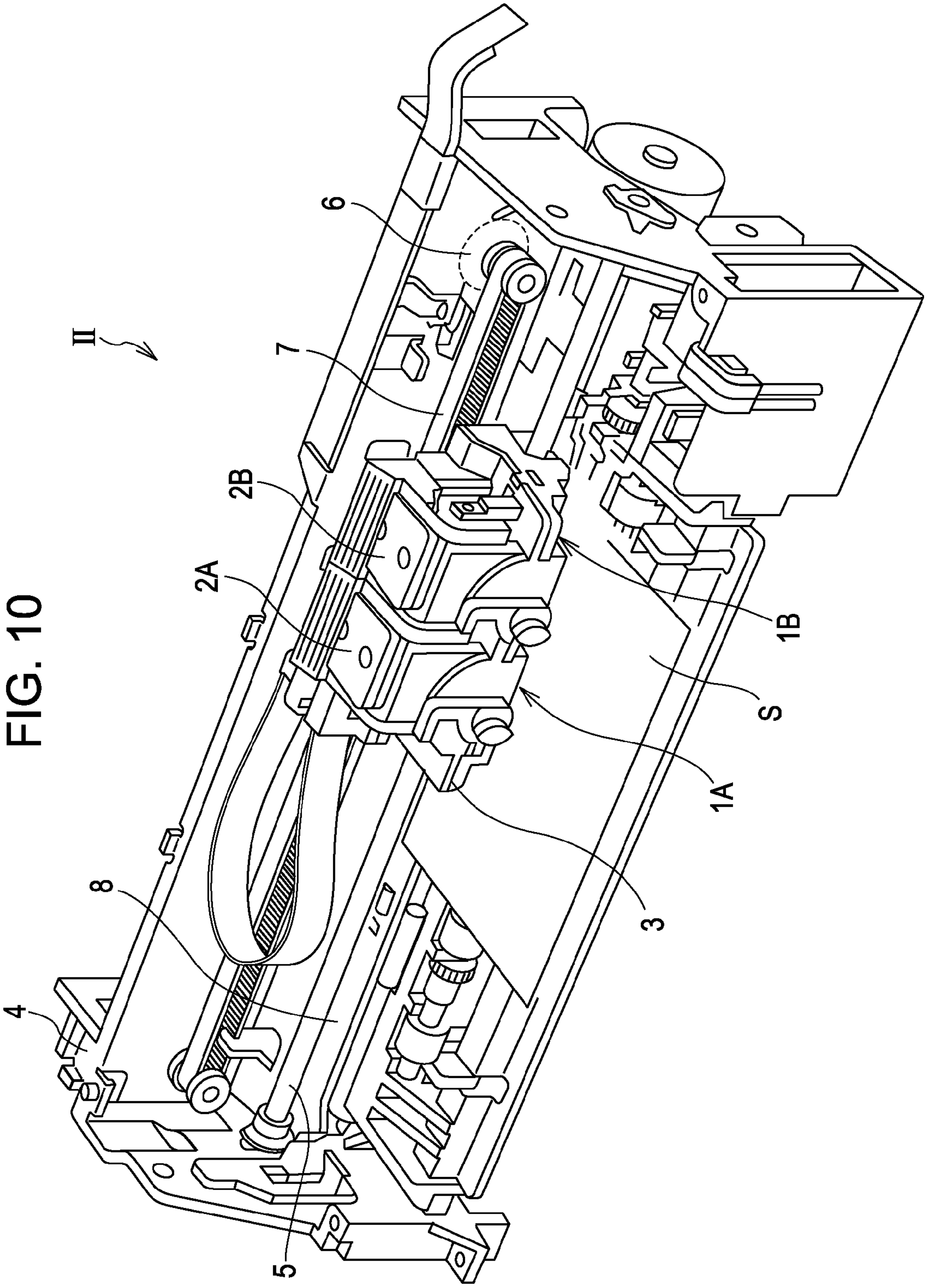
FIG. 10 is a schematic view of a recording device according to one embodiment.

The ink jet recording head I of each embodiment constitutes a portion of a recording head unit having an ink flow path communicating with an ink cartridge or the like, and is mounted on an ink jet recording device. FIG. 10 is a schematic configuration diagram illustrating one embodiment of the ink jet recording device.

In an ink jet recording device II illustrated in FIG. 10, cartridges 2A and 2B constituting an ink supply member are detachably provided in recording head units 1A and 1B having the ink jet recording head I. A carriage 3 on which the recording head units 1A and 1B are mounted is disposed at a carriage shaft 5 attached to a device main body 4 in such a manner as to freely move in the axial direction. The recording head units 1A and 1B eject a black ink composition and a color ink composition, respectively, for example.

Then, when the driving force of a driving motor 6 is transmitted to the carriage 3 through a plurality of gears and a timing belt 7, the carriage 3 carrying the recording head units 1A and 1B is moved along with a carriage shaft 5. In contrast, the device main body 4 is provided with a platen 8 along with the carriage shaft 5, so that a recording sheet S as a recording media, such as paper, which is fed by a paper feed roller (not illustrated) or the like is wound around the platen 8 to be transported.

Moreover, in the ink jet recording device II described above, an example in which the ink jet recording head I (head units 1A and 1B) is mounted on the carriage 3 and is moved in the main scanning direction is mentioned, but it is not limited thereto. For example, the invention can also be applied to a so-called line recording device in which the ink jet recording head I is fixed, and printing is performed simply by moving the recording sheet S, such as paper, in the subscanning direction.

In the first embodiment described above, the ink jet recording head is mentioned as one embodiment of the liquid ejecting head. However, the invention is widely directed to general liquid ejecting heads, and it is a matter of course that the invention can also be applied to liquid ejecting heads for ejecting liquids other than ink. As other liquid ejecting heads, various kinds of recording heads for use in image recording devices, such as a printer, a color material ejecting head for use in the production of color filters of liquid crystal displays, an electrode material ejecting head for use in the formation of electrodes of organic EL displays or FEDs (electric field emission display), a biological organic substance ejecting head for use in the production of bio chips, etc., are mentioned, for example.

The invention is not limited to the method for producing the piezoelectric element to be mounted on the liquid ejecting head typified by the ink jet recording head, and can also be applied to methods for producing piezoelectric elements to be mounted on other apparatuses.

What is claimed is:

1. A method for producing a liquid ejecting head provided with a piezoelectric element that has a first electrode, a piezoelectric layer, and a second electrode and that causes pressure changes in a pressure generating chamber communicating with a nozzle opening, the piezoelectric layer having a perovskite structure, and the piezoelectric layer being preferentially orientated in a (100) plane, the method comprising: polarizing the piezoelectric layer by applying an electric field having energy higher than energy required for converting the polarization direction in the <111> direction to the <110> direction and lower than energy required for converting the polarization direction in the <111> direction to the <001> direction when the electric field to be applied to the piezoelectric layer is in the <001> direction vertical to a plane on which the second electrode is provided.

2. The method for producing a liquid ejecting head according to claim 1, wherein, in the polarization process, the polarization direction under conversion turns to the <110> direction when the polarization direction of the piezoelectric layer is converted to the <111> direction from the <111> direction by the application of the electric field.

3. The method for producing a liquid ejecting head according to claim 1, wherein, in the polarization process, the piezoelectric layer does not enter a paraelectric state in which a polarization moment disappears.

4. The method for producing a liquid ejecting head according to claim 1, wherein the piezoelectric layer contains lead, zirconium, and titanium.

5. The method for producing a liquid ejecting head according to claim 1, wherein a lattice constant of the piezoelectric layer in the direction vertical to the plane on which the second electrode is provided is lower than a lattice constant in the plane direction of the plane on which the second electrode is provided.

6. The method for producing a liquid ejecting head according to claim 1, wherein the piezoelectric layer is monoclinic.

7. A liquid ejecting head, which is produced according to the production method according to claim 1.

8. A liquid ejecting device, comprising the liquid ejecting head according to claim 7.

9. A liquid ejecting head, which is produced according to the production method according to claim 2.

10. A liquid ejecting head, which is produced according to the production method according to claim 3.

11. A liquid ejecting head, which is produced according to the production method according to claim 4.

12. A liquid ejecting head, which is produced according to the production method according to claim 5.

13. A liquid ejecting head, which is produced according to the production method according to claim 6.

* * * * *